United States Patent
Ikeda

(10) Patent No.: US 6,400,299 B2
(45) Date of Patent: Jun. 4, 2002

(54) CAPACITANCE TYPE DIGITAL/ANALOG CONVERTER CAPABLE OF REDUCING TOTAL CAPACITANCE

(75) Inventor: Naoyasu Ikeda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/726,309

(22) Filed: Dec. 1, 2000

(30) Foreign Application Priority Data

Dec. 2, 1999 (JP) .......................................... 11-343279

(51) Int. Cl.[7] .............................. H03M 1/66; H03M 1/12
(52) U.S. Cl. ..................... 341/150; 341/144; 341/172
(58) Field of Search ................................. 341/150, 172, 341/144

(56) References Cited

U.S. PATENT DOCUMENTS

| | | | | |
|---|---|---|---|---|
| 4,404,544 A | * | 9/1983 | Dwaraknath | 341/172 |
| 4,843,393 A | * | 6/1989 | Kuraishi | 341/150 |
| 4,937,578 A | * | 6/1990 | Shioda | 341/150 |
| 5,235,335 A | * | 8/1993 | Hester et al. | 341/172 |
| 5,274,376 A | * | 12/1993 | Phillips et al. | 341/150 |
| 5,889,486 A | * | 3/1999 | Opris et al. | 341/150 |

FOREIGN PATENT DOCUMENTS

| | | |
|---|---|---|
| JP | 57-124933 | 8/1982 |
| JP | 63-67920 | 3/1988 |
| JP | 4-72819 | 3/1992 |

* cited by examiner

Primary Examiner—Peguy JeanPierre
Assistant Examiner—Jean Burner JeanGlaude
(74) Attorney, Agent, or Firm—Young & Thompson

(57) ABSTRACT

In a digital/analog converter for converting 2n-bit input digital data into an analog output voltage where n is 2, 3, ..., 2n capacitors, (n−1) coupling capacitors and 2n analog switches are provided. If k is 1, 2, ..., n, a (2k−1)-th capacitor has a unit capacitance, and a 2k-th capacitor has a capacitance twice the unit capacitance. A first terminal of the (2k−1)-th capacitor is connected to a first terminal of the 2k-th capacitor. Also, if m is 1, 2, ..., n−1, an m-th coupling capacitor is connected between the first terminal of the 2m-th capacitor and the first terminal of the (2m+t)-th capacitor, while an (n−1)-th coupling capacitor is connected to the output terminal. If m' is 2, 3, ..., n−1, the first coupling capacitor has the unit capacitance, and an m'-th one of coupling capacitor has a capacitance of the unit capacitance plus a quarter of the capacitance of an (m'−1)-th coupling capacitors. Each of the analog switches is responsive to one of the 2n input digital data and is connected between a second terminal of one of the capacitors and two power supply sources.

2 Claims, 10 Drawing Sheets

US 6,400,299 B2

CAPACITANCE TYPE DIGITAL/ANALOG CONVERTER CAPABLE OF REDUCING TOTAL CAPACITANCE

BACKGROUND OF THE INVENTION

1. Field of the Invention

The present invention relates to a digital/analog (D/A) converter using capacitors.

2. Description of the Related Art

In order to decrease the occupied area while the resolution is high, capacitance type D/A converters have been developed.

A first prior art D/A converter is constructed by capacitors having binary weighted capacitance that are connected to an output terminal. Also, analog switches are provided that are controlled by input digital data connected to the capacitors. Each of the analog switches applies a low reference voltage or a high reference voltage to the corresponding capacitor in accordance with the corresponding input digital data. Thus, the first prior art D/A converter can generate an analog voltage in accordance with the input digital data (see JP-A-63-67920). This will be explained later in detail.

In the above-mentioned first prior art D/A converter, however, since the total capacitance of the capacitors is still large. Thus, the occupied area is still large.

In second and third prior art D/A converters, in order to more decrease the total capacitance, coupling capacitors are added to the first prior art D/A converters (see JP-A-57-124933 & JP-A-4-72819). This also will be explained later in detail.

In the above-mentioned second and third prior art D/A converters, however, the total capacitance is still large, which would increase the occupied area.

SUMMARY OF THE INVENTION

It is object of the present invention to provide a capacitance type D/A converter capable of further decreasing the total capacitance.

According to the present invention, in a D/A converter for converting 2n-bit input digital data into an analog output voltage where n is 2, 3, . . . , 2n capacitors, (n−1) coupling capacitors and 2n analog switches are provided. If k is 1, 2, . . . , n, a (2k−1)-th capacitor has a unit capacitance, and a 2k-th capacitor has a capacitance twice the unit capacitance. A first terminal of the (2k−1)-th capacitor is connected to a first terminal of the 2k-th capacitor. Also, if m is 1, 2, . . . , n−1, an m-th coupling capacitor is connected between the first terminal of the 2m-th capacitor and the first terminal of the (2m+1)-th capacitor, while an (n−1)-th coupling capacitor is connected to the output terminal. If m' is 2, 3, . . . , n−1, the first coupling capacitor has the unit capacitance, and an m'-th one of coupling capacitors has a capacitance of the unit capacitance plus a quarter of the capacitance of an (m'−1)-th coupling capacitor. Each of the analog switches is responsive to one of the 2n input digital data and is connected between a second terminal of one of the capacitors and two power supply sources.

Note that, if the 2n-th capacitor and the 2n-th analog switch are omitted, the D/A converter serves as a (2n−1)-bit D/A converter.

BRIEF DESCRIPTION OF THE DRAWINGS

The present invention will be more clearly understood from the description set forth below, as compared with the prior art, with reference to the accompanying drawings, wherein.

DESCRIPTION OF THE PREFERRED EMBODIMENT

Before the description of the preferred embodiment, prior art D/A converters will be explained with reference to FIGS. 1, 2 and 3.

Figure 1:
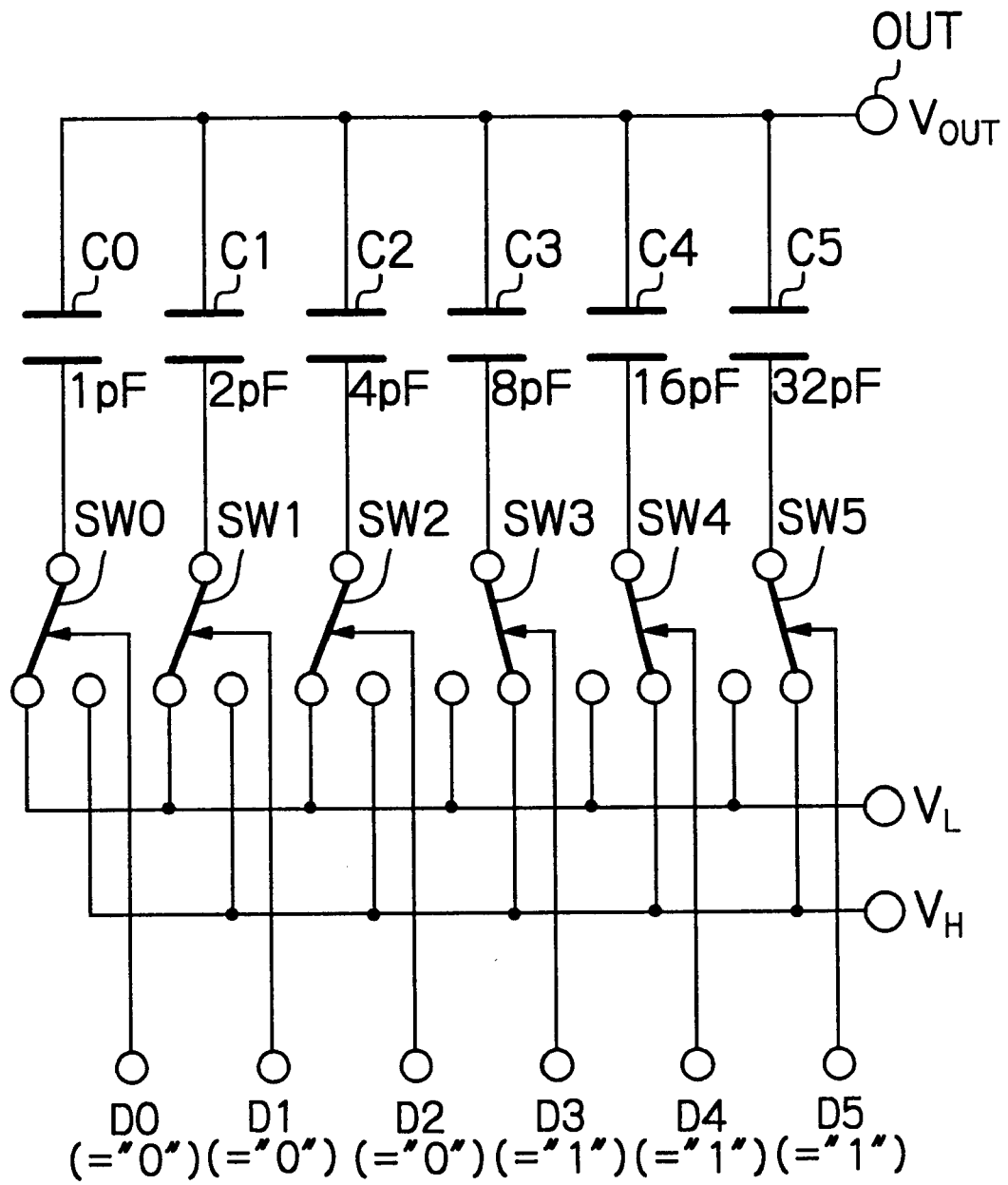
FIG. 1 is a circuit diagram illustrating a first prior art 6-bit D/A converter.

In FIG. 1, which illustrates a first prior art 6-bit D/A converter (see JP-A-63-67920), capacitors C0, C1, . . . , C5 having binary weighted capacitance such as 1pF, 2pF, . . . , 32pF, respectively, are connected to an output terminal OUT where voltage is $V_{OUT}$. Also, analog switches SW0, SW2, . . . , SW5 controlled by 6-bit input digital data D0, D1, . . . , D5 are connected to the capacitors C0, C1, . . . , C5, respectively. Each of the analog switches SW0, SW1, . . . , SW5 applies a reference voltage $V_L$ or $V_H$ to the corresponding capacitor in accordance with the corresponding input digital data.

For example, if (D0, D1, D2, D3, D4, D5)=(0, 0, 0, 0, 0, 0), the analog switches SW0, SW1, . . . , SW5 apply the reference voltage $V_L$ to the capacitors C0, C1, . . . , C5, respectively, so that the output voltage $V_{OUT}$ is $$V_{OUT} = 0/(1+2+\ldots+32)\cdot(V_H-V_L)+V_L = V_L$$

Also, if (D0, D1, D2, D3, D4, D5)=(1, 0, 0, 0, 0, 0), the analog switch SW0 applies the reference voltage $V_L$ to the capacitor C0 while the analog switches SW1, SW2, . . . , SW5 apply the reference voltage $V_H$ to the capacitors C1, C2, . . . , C5, so that the output voltage $V_{OUT}$ is $$V_{OUT} = 1/(1+2+\ldots+32)\cdot(V_H-V_L)+V_L = 1/63\cdot(V_H-V_L)+V_L$$

Further, if (D0, D1, D2, D3, D4, D5)=(1, 1, 1, 1, 1, 1), the analog switches SW0, SW1, . . . , SW5 apply the reference voltage $V_H$ to the capacitors C0, C1, . . . , C5, so that the output voltage $V_{OUT}$ is $$V_{OUT} = (1+2+\ldots+32)/(1+2+\ldots+32)\cdot(V_H-V_L)+V_L$$

Thus, the D/A converter of FIG. 1 can generate an analog voltage $V_{OUT}$ in accordance with the 6-bit input digital data (D0, D1, . . . , D5).

In the D/A converter of FIG. 1, since use is made of binary weighted capacitors, the occupied area can be decreased and the resolution can be higher as compared with conventional resistor string type D/A converters.

In the D/A converter of FIG. 1, however, the total capacitance $C_{TOTAL}$ of the capacitors C0, C1, . . . , C5 is 63pF and is still large. Note that if the number of the capacitors is n, the total capacitance $C_{TOTAL}$ thereof is represented by $$C_{TOTAL}=2^n-1(pF)$$

where the capacitance of the capacitor C0 is 1pF. Thus, the occupied area is still large.

Figure 2:
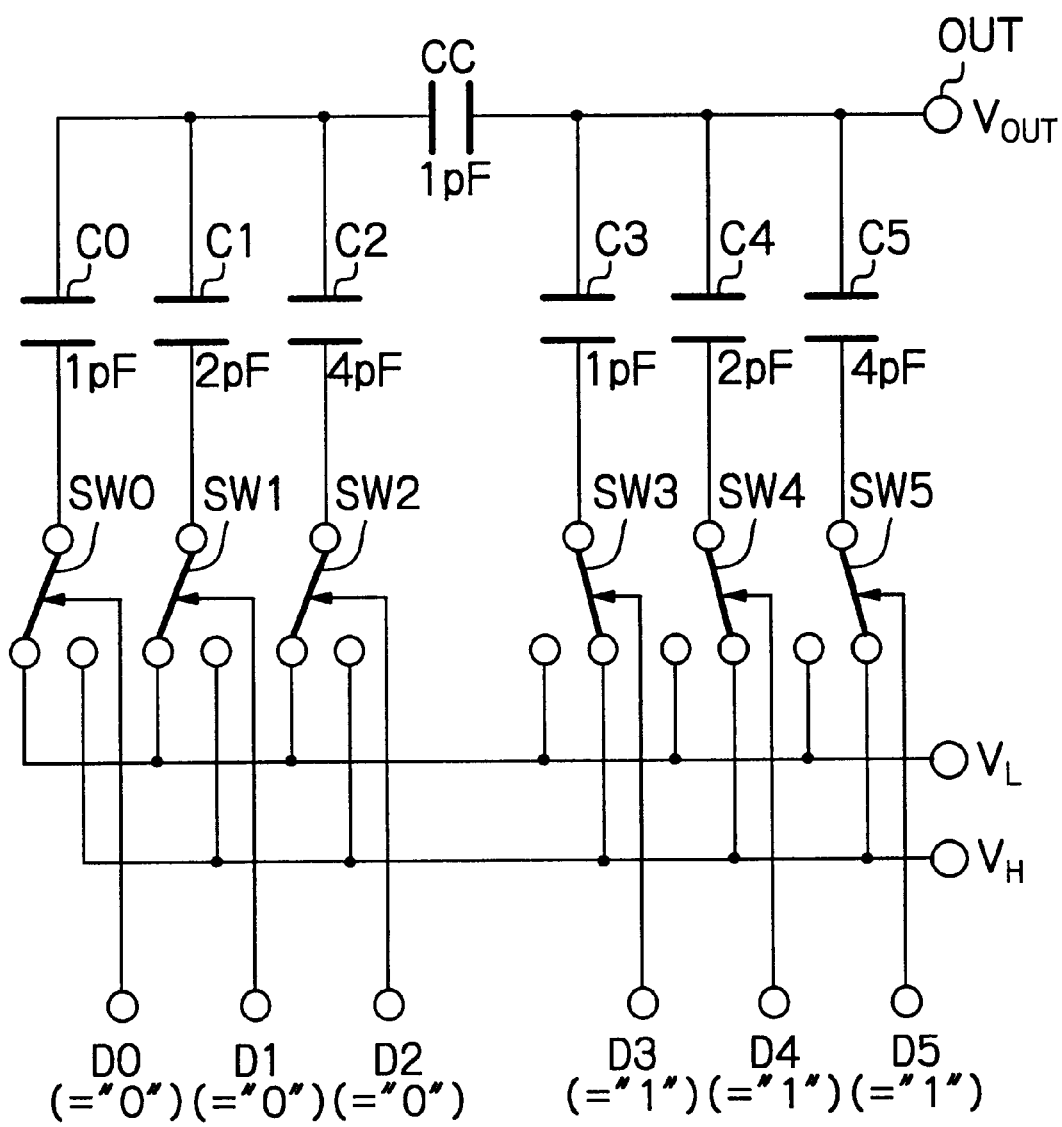
FIG. 2 is a circuit diagram illustrating a second prior art 6-bit D/A converter.

In FIG. 2, which illustrates a second prior art 6-bit D/A converter (see JP-A-57-124933), a coupling capacitor CC having a capacitance of 1pF is added to the elements of FIG. 1, and the capacitances of the capacitors C3, C4 and C5 are 1pF, 2pF and 4pF, respectively. The operation of the D/A converter of FIG. 2 is the same as that of the D/A converter of FIG. 1.

In the D/A converter of FIG. 2, the total capacitance $C_{TOTAL}$ of the capacitors C0, C1, . . . , C5 as well as the coupling capacitor CC is 15pF and is smaller than that of the D/A converter of FIG. 1.

Figure 3:
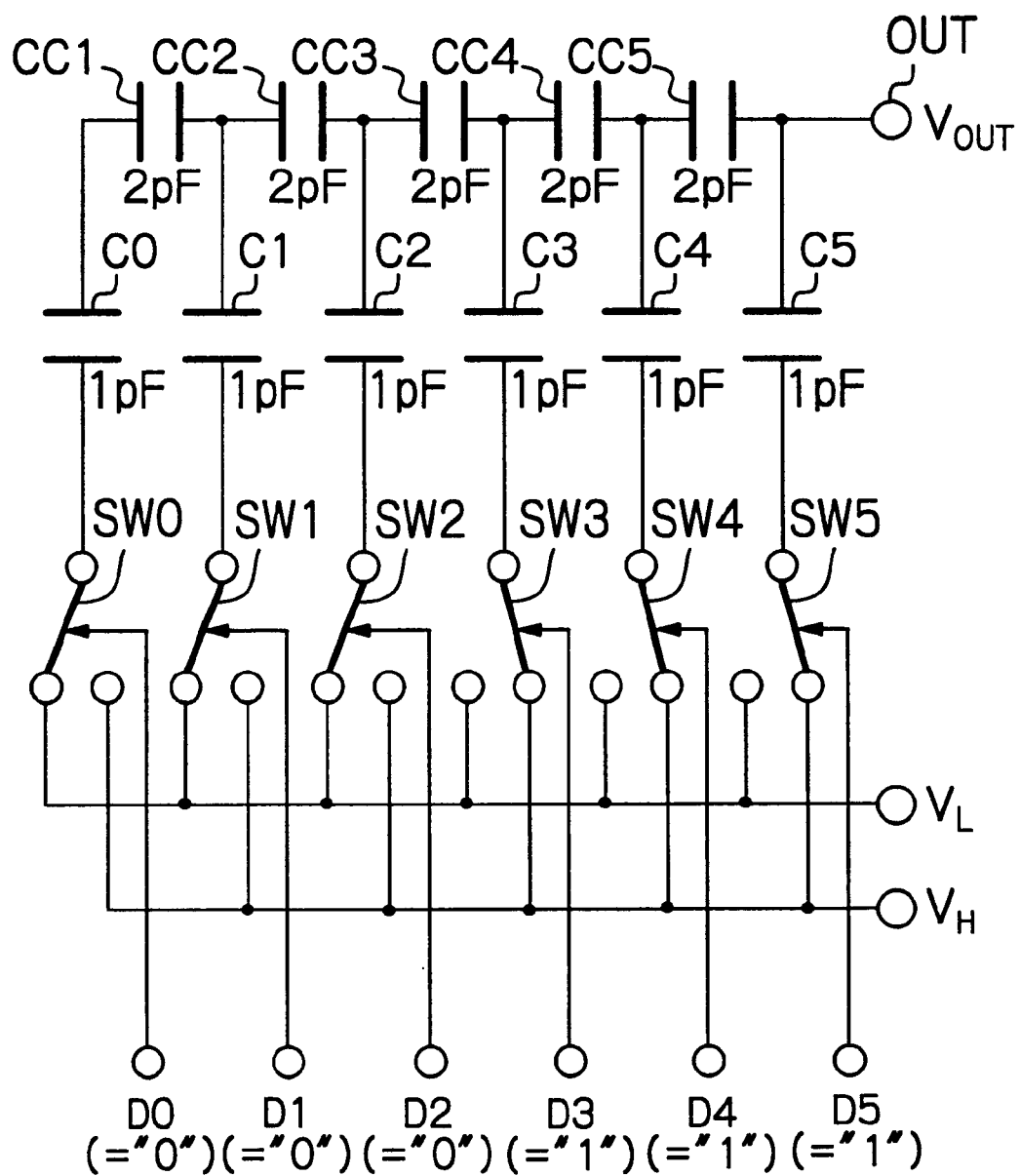
FIG. 3 is a circuit diagram illustrating a third prior art 6-bit D/A converter.

In FIG. 3, which illustrates a third prior art 6-bit D/A converter (see JP-A-4-72819), coupling capacitors CC1, CC2, . . . , CC5 having a capacitance of 1pF are added to the elements of FIG. 1, and the capacitances of the capacitors C0, C1, C2, C3, C4 and C5 are 1pF. The operation of the D/A converter of FIG. 3 is the same as that of the D/A converter FIG. 1.

In the D/A converter of FIG. 3, the total capacitance $C_{TOTAL}$ of the capacitors C0, C1, . . . , C5 as well as the coupling capacitors CC1, CC2, CC3, CC4 and CC5 is 16pF and is smaller than that of the D/A converter of FIG. 1.

In the D/A converters of FIGS. 2 and 3, however, the total capacitance $C_{TOTAL}$ is still large, which would increase the occupied area.

Figure 4:
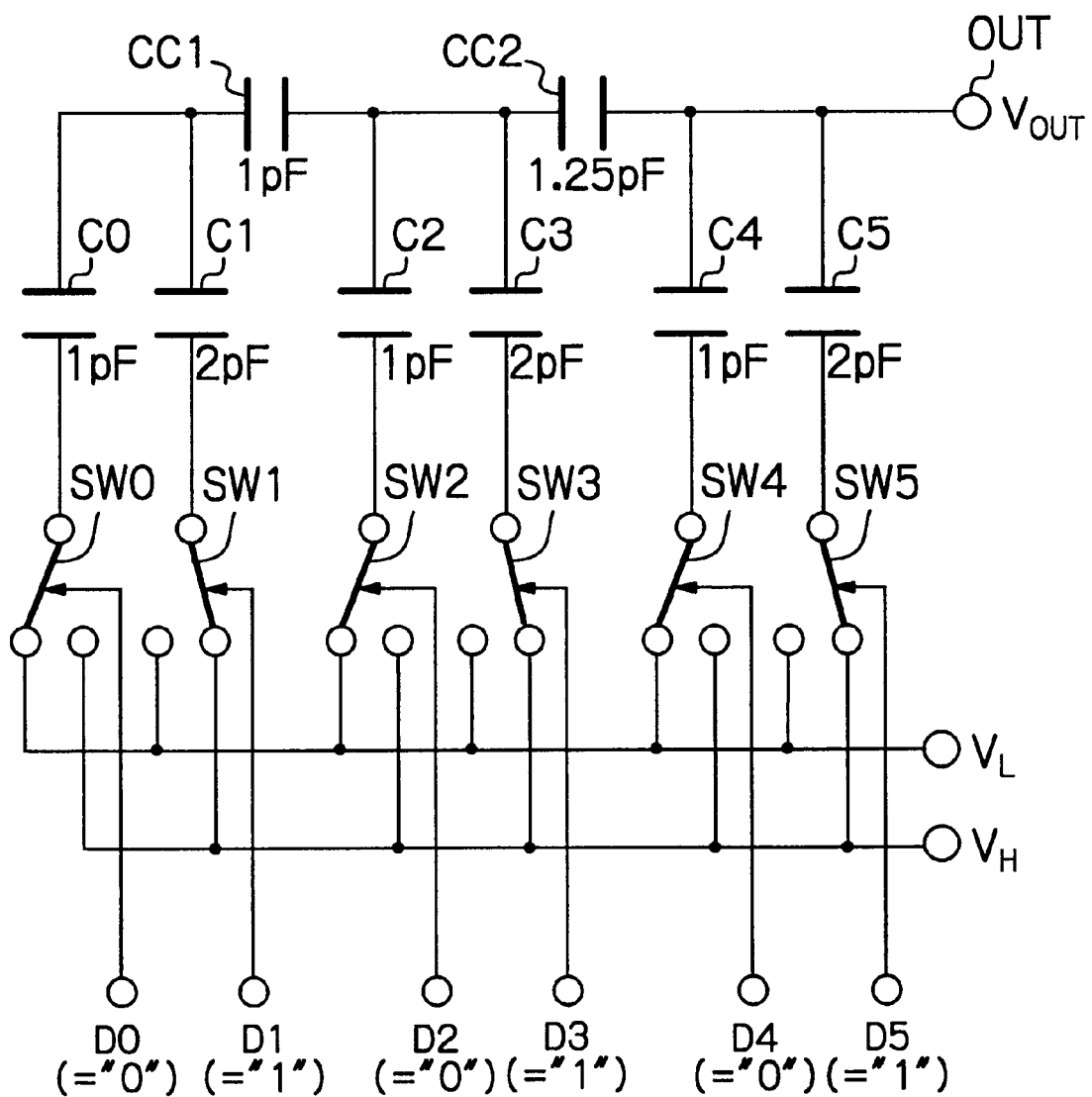
FIG. 4 is a circuit diagram illustrating an embodiment of the D/A converter according to the present invention.
Figure 5:
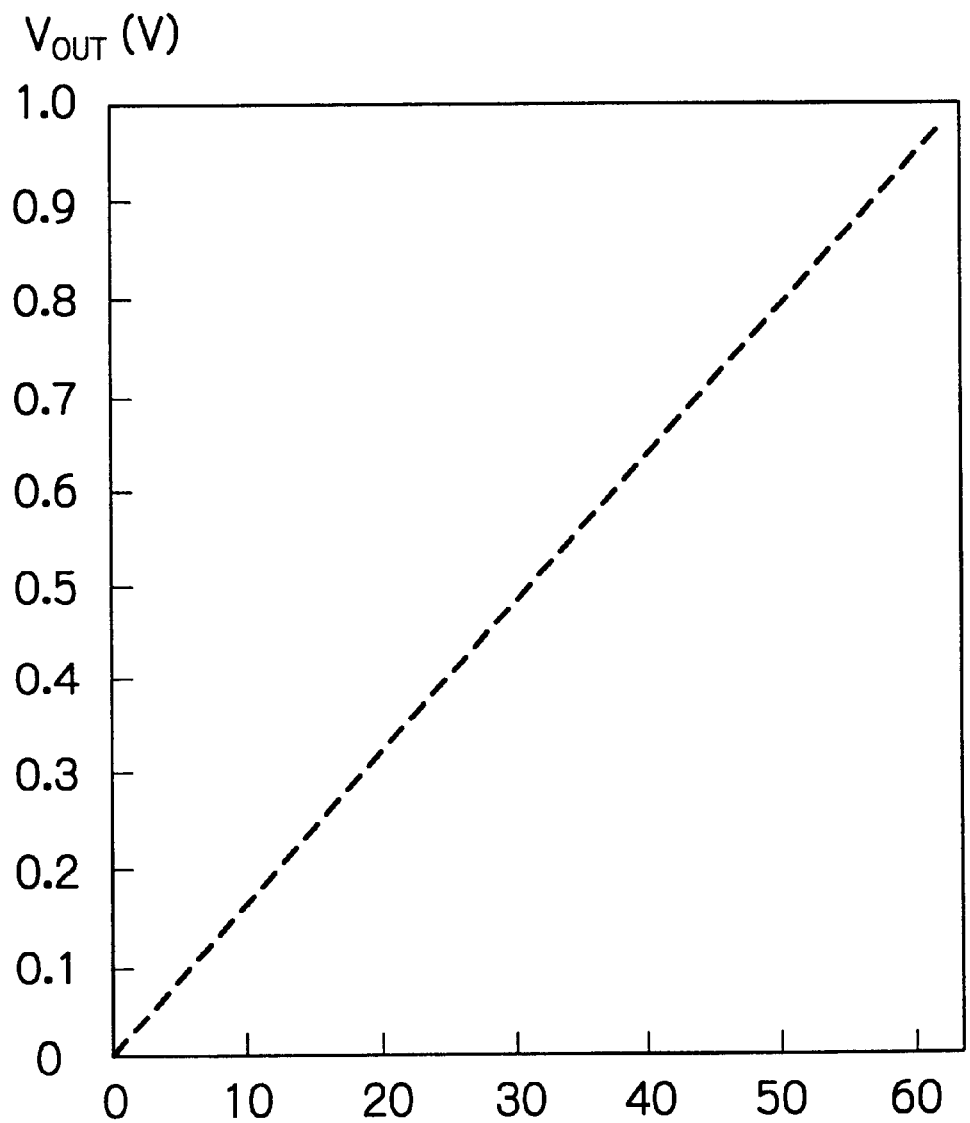
FIG. 5 is a diagram showing the relationship between the input digital data and the output voltage of FIG. 4.

In FIG. 4, which illustrates an embodiment of the D/A converter according to the present invention, coupling capacitors CC1 and CC2 having capacitances of 1pF and 1.25pF, respectively, are added to the elements of FIG. 1, and the capacitance's of the capacitors C0, C1, C2, C3, C4 and C5 are 1pF, 2pF, 1pF, 2pF, 1pF and 2pF, respectively. The operation of the D/A converter of FIG. 4 is the same as that of the D/A converter of FIG. 5 which shows a relationship between the input digital data (D5, D4, D3, D2, D1, D0) and the output voltage $V_{OUT}$ where $V_L$ is 1V and $V_H$ is 1V.

In the D/A converter of FIG. 4, the total capacitance $C_{TOTAL}$ of the capacitors C0, C1, . . . , C5 as well as the coupling capacitors CC1 and CC2 is 11.25pF and is smaller than those of the D/A converter of FIGS. 1, 2 and 3, which would decrease the occupied area.

Figure 6:
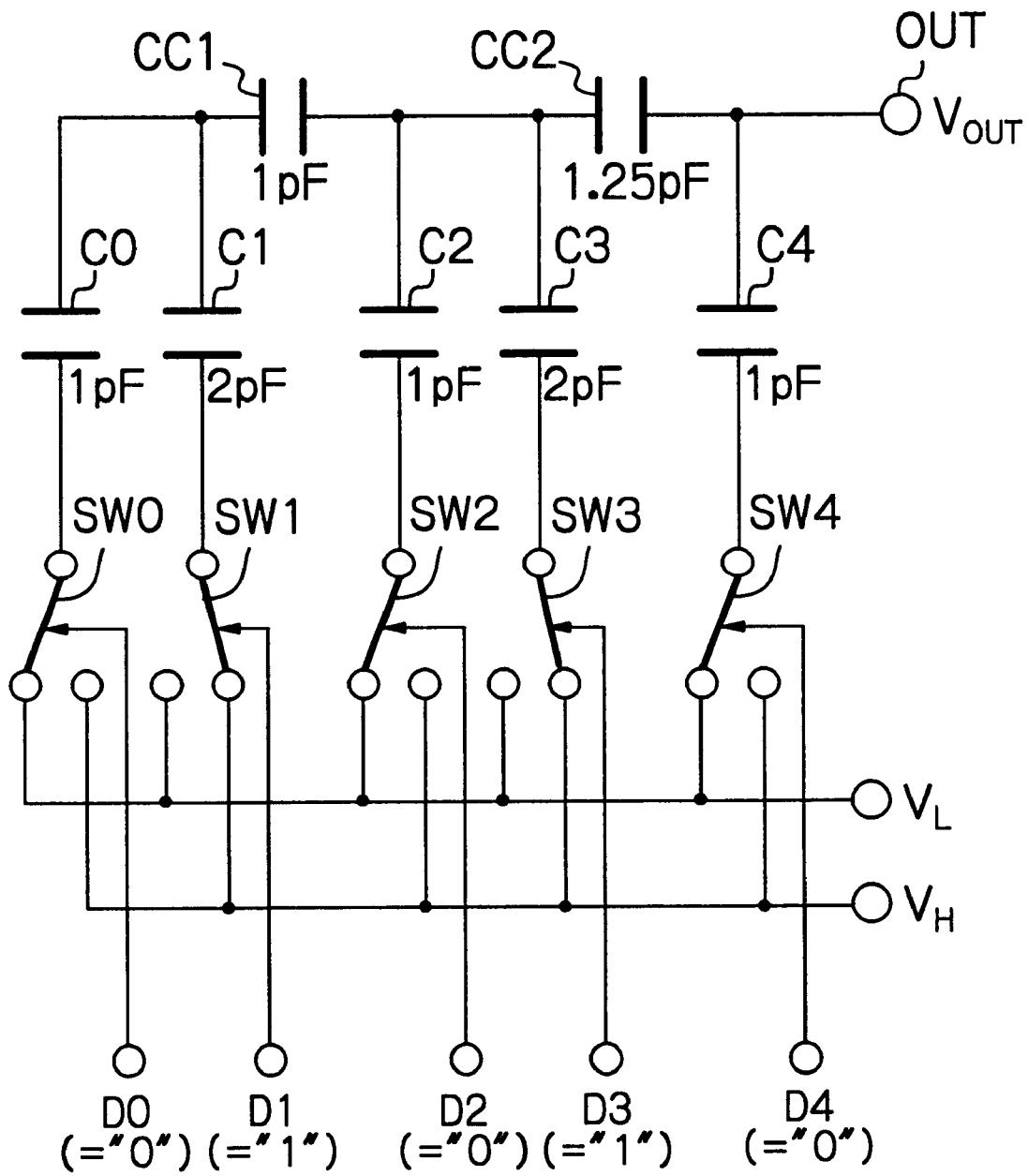
FIG. 6 is a circuit diagram illustrating a modification of the D/A converter of FIG. 4.
Figure 7:
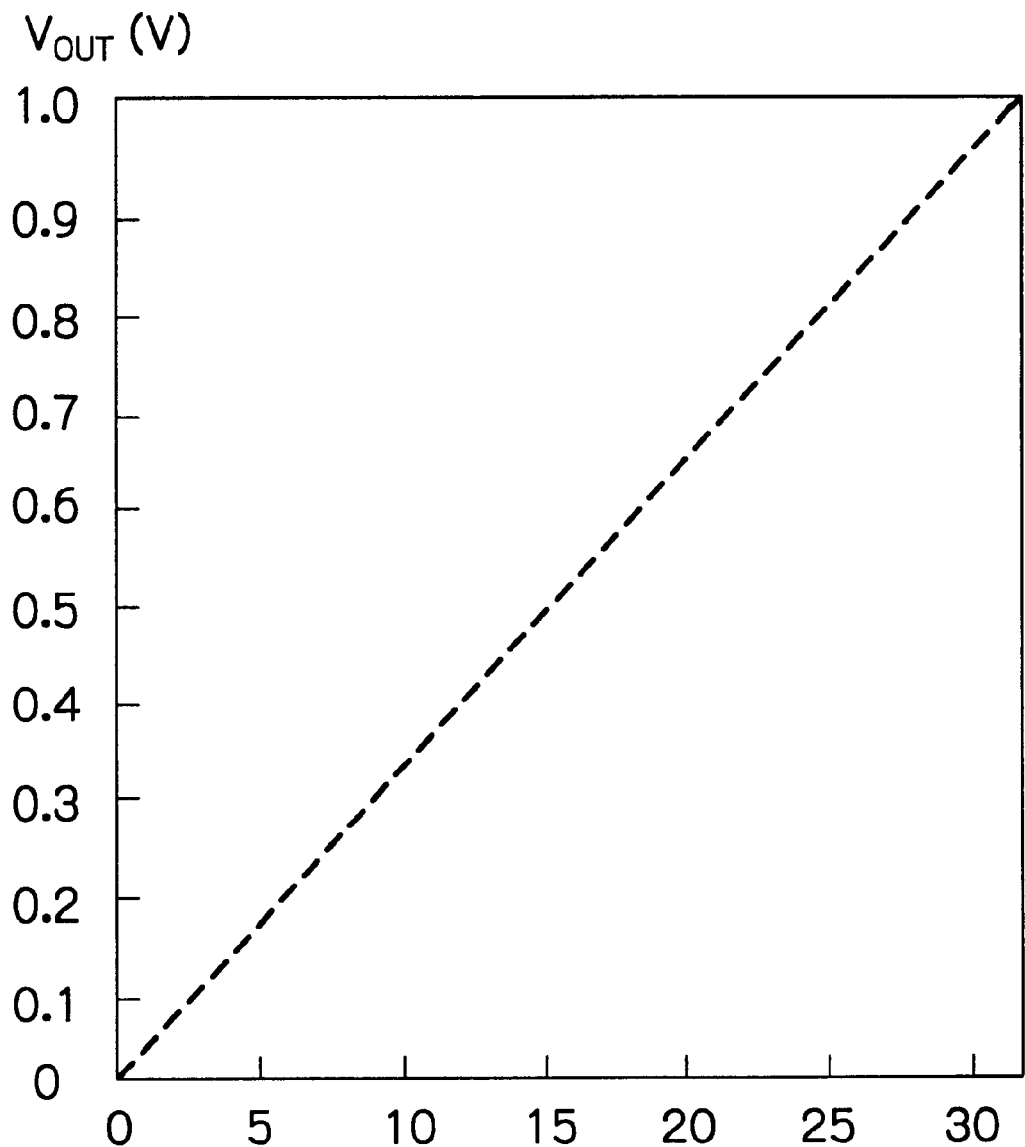
FIG. 7 is a diagram showing the relationship between the input digital data and the output voltage of FIG. 6.

In FIG. 6, which illustrates a modification of the D/A converter of FIG. 4, the D/A converter of FIG. 4 is applied to a 5-bit D/A converter where the capacitor C5 and the analog switch SW5 of FIG. 4 are omitted. Note that the total capacitance $C_{TOTAL}$ of the D/A converter of FIG. 6 is smaller than that of the corresponding prior art D/A converter. In this case, FIG. 7 shows a relationship between the input digital data (D4, D3, D2, D1, D0) and the output voltage $V_{OUT}$ where $V_L$ is 1V and $V_H$ is 1V.

Figure 8:
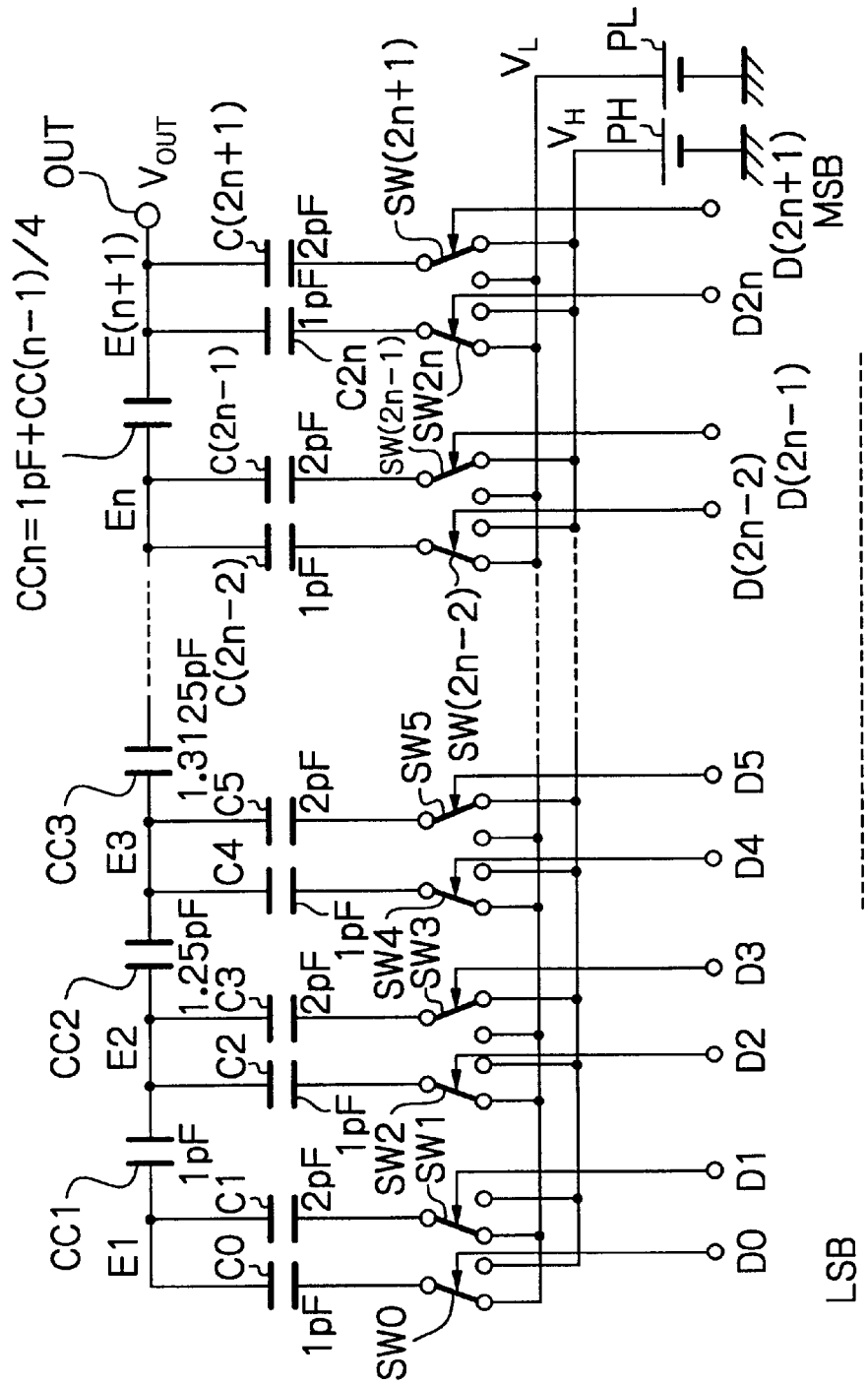
FIG. 8 is a circuit diagram illustrating a generalized D/A converter from the D/A converter of FIG. 4.

In FIG. 8, which illustrates a generalized (2n+2)-bit D/A converter from the D/A converter of FIG. 4, capacitors C0, C1, C3, C4, . . . , C2n, C(2n+1) are provided where n is 1, 2, . . . In this case, the capacitance each of the capacitors C0, C2, . . . , C2n is 1pF which is a unit value or a minimum value, and the capacitance of each of the capacitors C1, C3, . . . , C(2n+1) is 2pF.

A first terminal of the capacitor C2k is connected to a first terminal of the capacitor C(2k+1) where k is 0, 1, . . . , n.

Also, one coupling capacitor CCk is connected between the first terminals of the capacitors C(2k−2) and C(2k−1) where k is 0, 1, . . . , n. In this case, the capacitance of the coupling capacitor CCk is represented by $$CCk=C+CC(k-1)/4$$

where C is 1pF (unit value).

Further, the coupling capacitor CCn is connected to an output terminal OUT whose voltage is $V_{OUT}$.

On the other hand, one analog switch SW(2k+1) is connected to a second terminal of the capacitor C(2k+1) where k is 0, 1, . . . , n. The analog switch SW(2k+1) is controlled by input digital data D(2k+1) to connect the second terminal of the capacitor C(2k+1) to either a power supply source PL or a power supply source PH. Note that the power supply sources PL and PH generate voltages $V_L$ and $V_H$, respectively.

If the D/A converter of FIG. 8 operates a D/A converter where $V_L$ is 0V and $V_H$ is 1V, a voltage E(n+1) equal to the output voltage $V_{OUT}$ has to satisfy the following equation:

$$E(n+1)=(D0+2\cdot D1+\ldots 2^{2n+1}\cdot D(2n+1))/(2^{2n+2}-1)\ (V) \quad (1)$$

This equation (1) will be proved by using the following induction method.

Figure 9:
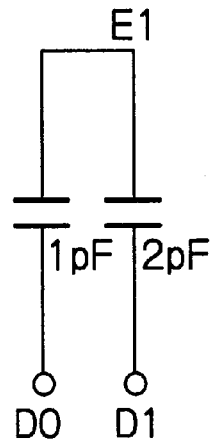
FIGS. 9 and 10 are circuit diagrams for explaining the operation of the D/A converter of FIG. 8.

First, assume that n is 0. In this case, an equivalent circuit diagram of the D/A converter of FIG. 8 is illustrated in FIG. 9. That is, a voltage E1 (D0) derived by the digital data D0 is $$E1(D0)=1pF/(1pF+2pF)=\tfrac{1}{3}$$

Also, a voltage E1(D1) derived by the digital data D1 is $$E1(D1)=2pF/(1pF+2pF)$$

Therefore, from Thevenin's therem, $$E1=E1(D0)\cdot D0+E1(D1)\cdot D1=(D0+2\cdot D1)/3$$

Thus, the equation (1) where n=1 is proved.

Next, assume that the equation (1) where n=k−1 is established, i.e., $$Ek=(D0+2\cdot D1+\ldots+2^{2k-1}\cdot D(2k-1))/(2^{2k-2}-1) \quad (2)$$

Figure 10:
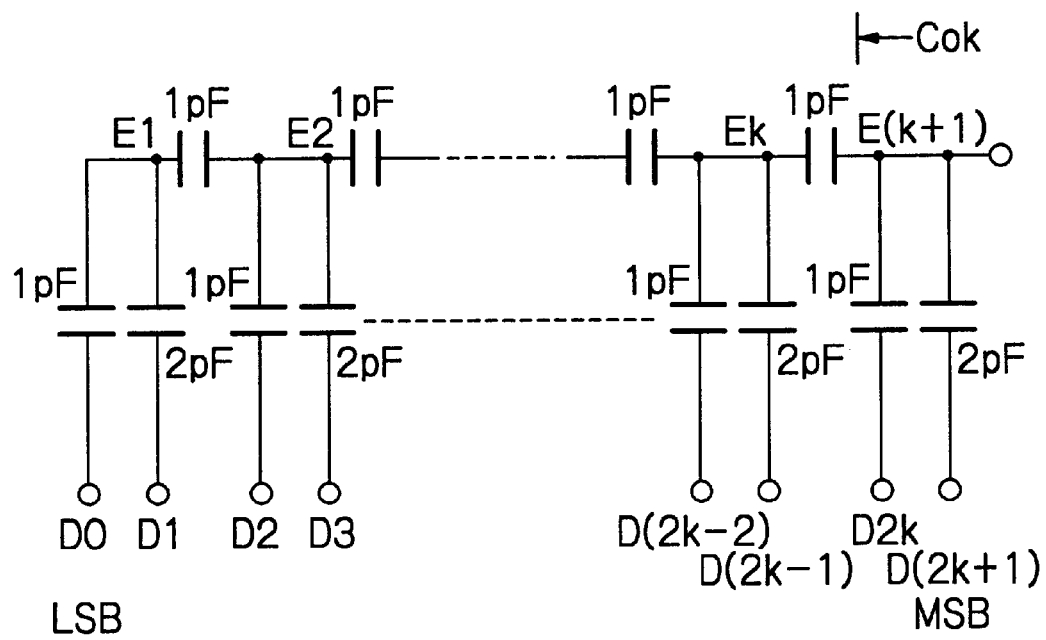

Next, consider that n is k+1 as illustrated in FIG. 10. In this case, a conductance $C_{ok}$ from a point whose voltage E(k+1) is given by $$C_{ok}=(1-e^{-2k})\cdot C=(1-e^{-2k})\ (pF) \quad (3)$$

Therefore, the voltage E(k+1) of FIG. 10 is calculated by $$E(k+1)=(C_{ok}\cdot Ek+1pF\cdot D2k+2pF\cdot D(2k+1))/(C_{ok}+1pF+2pF) \quad (4)$$

Thus, from the equations (2), (3) and (4), $$E(k+1)=((1-2^{-2k})\cdot(D0+2\cdot D1+\ldots+2^{2k-1}\cdot D(2k-1)/(2^{2k-2}-1)+((D2k+$$

$$D(2k+1))/(4-2^{-2k})$$

$$=(D0+2\cdot D1+\ldots+2^{2k-1}\cdot D(2k-1)+2^{2k}\cdot D2k+D^{2k+1}\cdot D(2k+1))/(2^{2k+2}-1)$$

Thus, the equation (1) has been proved.

Figure 11:
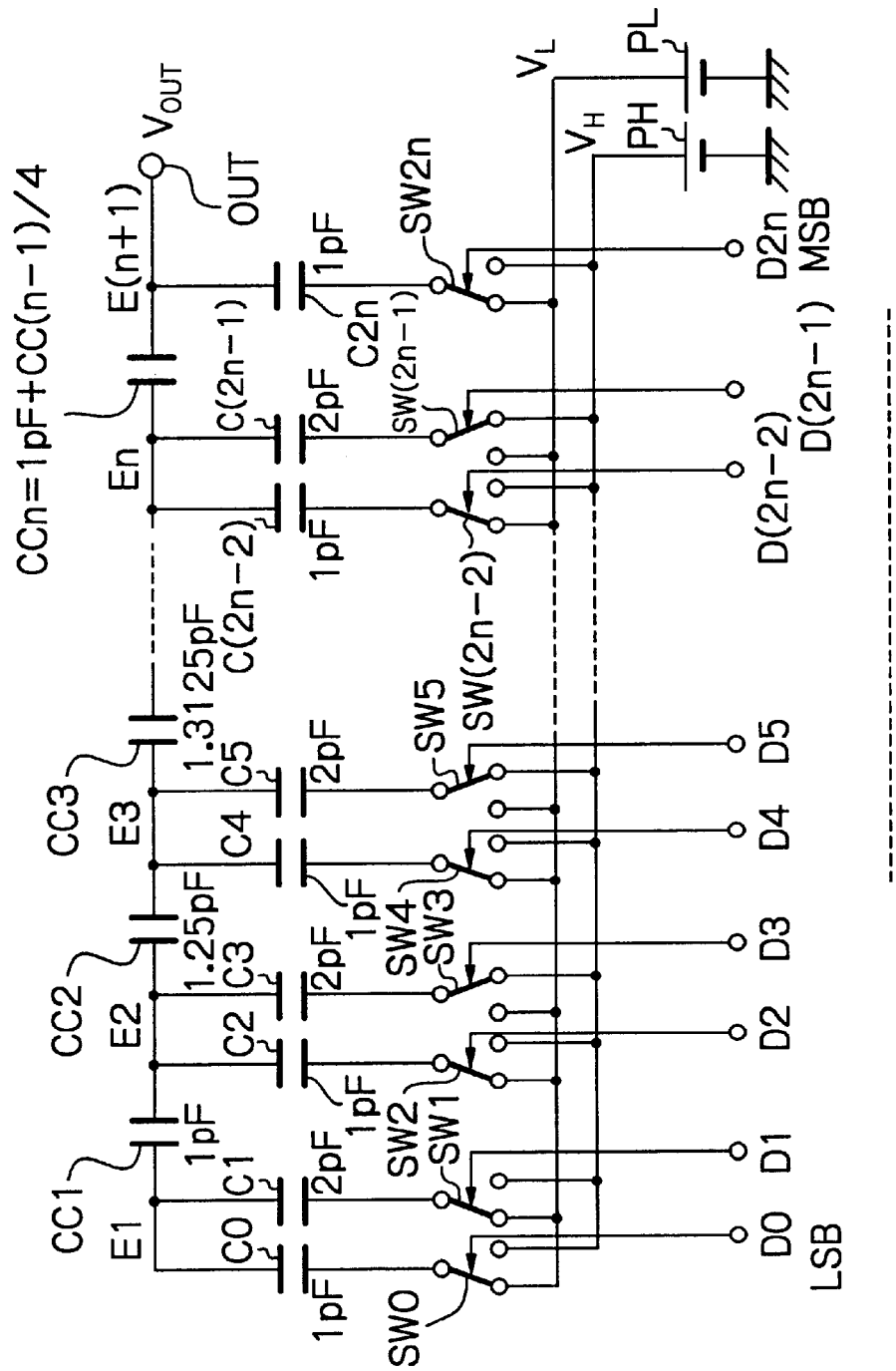
FIG. 11 is a circuit diagram illustrating a generalized D/A converter from the D/A converter of FIG. 6.

In FIG. 11, which illustrates a generalized (2n+1)-bit D/A converter from the D/A converter of FIG. 6, capacitors C0, C1, C3, C4, ..., C(2n−1), C2n are provided where n is 1, 2, ... That is, the capacitor C(2n+1) and the analog switch SW(2n+1) of FIG. 8 are omitted. In this case, the equation (1) is replaced by $$E(n+1)=(D0+2\cdot D1+\ldots+2^{2n+1}\cdot D2n)/(2^{2n+2}-1) \quad (5)$$

As explained hereinabove, according to the present invention, since the total capacitance is small, the occupied area can be decreased.

What is claimed is:

1. A digital/analog converter for converting 2n-bit input digital data into an analog output voltage where n is 2, 3, ..., comprising:

2n capacitors, a (2k−1)-th one of said capacitors having a unit capacitance, a 2k-th one of said capacitors having a capacitance twice said unit capacitance, a first terminal of said (2k−1)-th capacitor being connected to a first terminal of said 2k-th capacitor, where k is 1, 2, ..., n;

(n−1) coupling capacitors, an m-th one of said coupling capacitors being connected between the first terminal of said 2m-th capacitor and the first terminal of said (2m+1)-th capacitor, an (n−1)-th one of said coupling capacitors being connected to said output terminal, the first coupling capacitor having said unit capacitance, an m'-th one of coupling capacitors having a capacitance of said unit capacitance plus a quarter of the capacitance of an (m'−1)-th one of said coupling capacitors, where m is 1, 2, ..., n−1 and m' is 2, 3, ..., n−1; and 2n analog switches, each responsive to one of said 2n input digital data and connected between a second terminal of one of said capacitors and two power supply sources.

2. A digital/analog converter for converting (2n−1)-bit input digital data into an analog output voltage where n is 2, 3, ..., comprising:

(2n−1) capacitors, a (2k−1)-th one of said capacitors having a unit capacitance, a 2k-th one of said capacitors having a capacitance twice said unit capacitance, a first terminal of said (2k−1)-th capacitor being connected to a first terminal of said 2k-th capacitor, where k is 1, 2, ..., n−1;

(n−1) coupling capacitors, an m-th one of said coupling capacitors being connected between the first terminal of said 2m-th capacitor and the first terminal of said (2m+1)-th capacitor, an (n−1)-th one of said coupling capacitors being connected to said output terminal, the first coupling capacitor having said unit capacitance, an m'-th one of coupling capacitors having a capacitance of said unit capacitance plus a quarter of the capacitance of an (m'−1)-th one of said coupling capacitors, where m is 1, 2, ..., n−1 and m' is 2, 3, ..., n−1; and (2n−1) analog switches, each responsive to one of said (2n−1) input digital data and connected between a second terminal of one of said capacitors and two power supply sources.

\* \* \* \* \*